(12) United States Patent
McLaughlin

(10) Patent No.: US 7,787,544 B2
(45) Date of Patent: Aug. 31, 2010

(54) METHOD AND APPARATUS FOR GENERATING CODEWORDS

(75) Inventor: Michael McLaughlin, Dublin (IE)

(73) Assignee: Delaware Limited, Dublin (IE)

( * ) Notice: Subject to any disclaimer, the term of this patent is extended or adjusted under 35 U.S.C. 154(b) by 810 days.

(21) Appl. No.: 11/309,221

(22) Filed: Jul. 13, 2006

(65) Prior Publication Data

US 2008/0013602 A1  Jan. 17, 2008

(51) Int. Cl.
*H04B 14/04* (2006.01)
(52) U.S. Cl. .................................... 375/253
(58) Field of Classification Search ............ 375/242, 375/253, 260, 295, 300; 341/56, 57, 59, 341/67, 70, 71
See application file for complete search history.

(56) References Cited

U.S. PATENT DOCUMENTS

| | | | |
|---|---|---|---|
| 7,139,237 B2 * | 11/2006 | Nangia et al. | 370/208 |
| 2003/0016733 A1 * | 1/2003 | Cha | 375/149 |
| 2003/0185281 A1 * | 10/2003 | Roh | 375/140 |
| 2006/0088080 A1 * | 4/2006 | Cha et al. | 375/130 |
| 2009/0129502 A1 * | 5/2009 | Tong et al. | 375/299 |

OTHER PUBLICATIONS

Hoholdt et al.,"Ternary sequences with Perfect Periodic Autocorrelation", IEEE Transactions on Information Theory, vol. 29, No. 4, pp. 597-600, May 1983.
Golay,"Sieves for Low Autocorrelation Binary Sequences", IEEE Transactions on Information Theory, vol. IT-23, pp. 43-51, Jan. 1977.

* cited by examiner

*Primary Examiner*—Young T. Tse
(74) *Attorney, Agent, or Firm*—Jeffrey Van Myers; Joseph Pumo; Artie A. Pennington

(57) ABSTRACT

The invention describes a method and device for designing a set of codewords, which have good properties for use in communication systems. These codeword sets are useful because they provide advantages to a communication system that uses them in that they result in lower error rates in the receiver. The method for designing the codes is to take a good set of codes with perfect periodic autocorrelation and manipulate it so as to transform it into a better code-set, for example a code-set with higher mean Golay merit factor, lower spectral peak to average ratio and lower mean cross correlation.

22 Claims, 2 Drawing Sheets

METHOD AND APPARATUS FOR GENERATING CODEWORDS

BACKGROUND OF THE INVENTION

1. Field of the Invention

The present invention relates generally to codewords useful for channel sounding and ranging in communication systems.

2. Description of the Related Art

Periodic Autocorrelation

It is well known by those skilled in the art, that codes which have so called perfect periodic autocorrelation are useful for channel sounding. If a code has perfect autocorrelation, then its periodic autocorrelation has one peak and is zero everywhere else.

Auto correlation is the cross correlation of a signal with itself. Say for example a code is of length N. Its periodic autocorrelation can be calculated by multiplying every element of it by every element of the same code, circularly shifted by a phase offset and summing the results of this multiplication. This is done at all possible phases.

The periodic autocorrelation R at lag j for signal $x_n$ is $$R(j) = \Sigma_n x_n x_{n-j} \quad [\text{Eq. 1}]$$

where $\Sigma_n$ indicates the sum over all n.

Merit Factor

Another desirable property for a code is that it has low aperiodic autocorrelation side lobes. This is desirable especially in codes used to send data with Direct Sequence modulation. The lower the autocorrelation side lobes, the lower the amount of energy that spills over into adjacent symbols and so the lower the inter-symbol interference (ISI) produced by the codes themselves.

A commonly used measure of how good the code is in this respect is known as the Golay Merit Factor (GMF) or often simply the Merit Factor.

The Merit Factor is a measure of the quality of the autocorrelation function of a code. To calculate the merit factor the aperiodic autocorrelation function is calculated and then the merit factor is the ratio of the square of the central term to the sum of the squares of the off-peak terms.

This measure was introduced by M. J. E. Golay in "Sieves for Low Autocorrelation Binary Sequences", *IEEE Transactions on Information Theory*, vol. IT-23, pp. 43-51, January 1977.

The binary sequences with the highest known Merit Factors are the length 13 and 11 Barker sequences with Merit factors of 14.08 and 12.10 respectively. By comparison, the mean Golay merit factor of the length 32 Walsh-Hadamard matrix is 0.194.

A code with perfect periodic autocorrelation, known here as a PAC code, is then a code where R(j) is zero for all j except when j=0.

A family of ternary sequences with perfect periodic autocorrelation was discovered by Valery Ipatov ("Ternary sequences with ideal autocorrelation properties", *Radio Eng. Electron. Phys.*, vol. 24, pp. 75-79, October 1979) and extended by T. Hoholdt, et al. ("Ternary sequences with Perfect Periodic Autocorrelation", *IEEE Transactions on Information Theory*, vol. 29, no. 4, pp. 597-600, May 1983) ("Hoholdt, et al."). There are many sequences in this family, for example, lengths 7, 13, 21, 31, 57, 63, 73, 91, 127, 133, 183, 273, 307, 381, 511, 553, 651, 757, 871, 993, 1057, 1407, 1723.

Cross Correlation

When a communications system 10 (see, FIG. 1) uses a set of codewords and the different codewords within that set are used for different purposes, e.g. to represent different data, or to provide isolation between different channels, it is desirable for these codewords to have low cross correlation with each other. This will reduce the chance of a receiver correlator being triggered by the wrong code. The wrong code could be present because, for example, there are echoes or reflections present of codes previously transmitted by transmitter 12, or for example, two or more channels are being received by receiver 14. Or the wrong code could be present because a different data code is being transmitted than is detected.

Spectral Peak to Average Ratio

For some communications systems the transmit power limits are set in terms of spectral power density. An example of this type of system is ultra wideband communications. The most useful part of the allowed transmit spectrum is flat. If a signal complies with these regulations, its worst case spectral density must stay below this straight line. If the signal spectrum has a peak anywhere, this peak must be kept below a certain limit by attenuating it and the rest of the signal. This effectively means that the whole signal must be penalized by any amount that the spectral peak to average ratio (SPAR) is above 0 dB. For this reason the SPAR needs to be kept as low as possible for codes used in these types of communications systems.

What is needed is a new technique which can generate codes with perfect periodic autocorrelation and, among other properties, relatively large Golay Merit Factors, good cross correlation and low spectral peak to average ratios.

BRIEF SUMMARY OF THE INVENTION

In accordance with a preferred embodiment of my invention, I provide a method for generating, from a codeword set, H, comprising a number, m, of different codewords, each of length, n, such that each of said codewords has perfect periodic autocorrelation and no codeword in said codeword set is the same as any other, even when cyclically shifted, codewords for use in a communication system. In general, I first measure a quality of each codeword m in H and for said codeword cyclically shifted by all possible shifts from 1 to n. Then, I remember, for each codeword m in H, a small number, w, of the best results measured in step 1. Finally, I choose, for each of the m codewords in H, only one of the w codewords remembered in step 2, based on a cross correlation of all m chosen codewords.

In a communication system 10, signals transmitted between the transmitter 12 and the receiver 14 may employ my chosen codewords for channel sounding and ranging.

I submit that my invention generates better codeword sets than any prior art method or apparatus now known to me.

BRIEF DESCRIPTION OF THE SEVERAL VIEWS OF THE DRAWINGS

My invention may be more fully understood by a description of certain preferred embodiments in conjunction with the attached drawings in which.

DETAILED DESCRIPTION OF THE INVENTION

Figure 1:
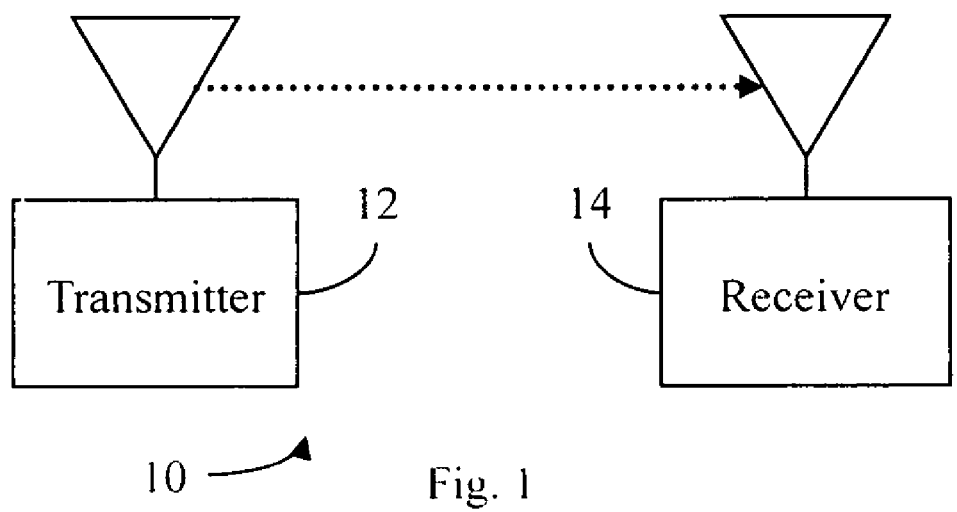
FIG. 1 is a general communication system within which my invention may be advantageously incorporated.

Giving an example for length 31 codes and using the method outlined in Hoholdt, et al., and using a base cyclic difference set: D={1, 5, 11, 24, 25, 2} with parameters L=31, k=6, λ=1 it is possible to generate 20 different PAC codes. They are generated by using pairs of difference sets rD and nD where the multipliers r and n are {−1, 2} and {−1, 1, 2, 3, 4, 8, 11, 12, 16, 17}, respectively. These 20 are all different in that no two of them are the same even when cyclically shifted by any shift amount. Each of them is of length 31 and has 15 1s, 6 0s and 10 −1s.

As expected all the codes have perfect periodic auto-correlation but a further useful property is that if the absolute value of the code is taken, i.e., substituting a 1 for −1, this modified code has 2 valued autocorrelation. In this case 25 and 20 are the two values. If we denote the original code OC and the modified code MC1 and make a further modification where all zeros in MC1 are replaced by −4. Denote this further modified code MC2. The periodic cross correlation of MC1 by MC2 is useful because it is zero valued at all points except for the zero shift point.

This is useful because a receiver 14 which consists of an energy detector followed by a correlator can get an estimate of the channel impulse response. The code MC1 corresponds to the input to the receiver after the energy detector if the original unmodified code is being received. By using MC2 in the correlator the output is zero valued except at the zero shift point.

In the case outlined above the two values of autocorrelation are 25 and 20. Ideally these two values will be as far apart as possible. The further apart they are the less receiver energy is wasted in the lower value and the better the noise immunity is.

Another example for length 31 codes and using the method outlined in Hoholdt, et al., and this time using a base cyclic difference set: D={1 2 3 4 6 8 12 15 16 17 23 24 27 29 30] with parameters L=31, k=15, λ=7.

In this case it is possible to generate 12 different PAC codes. They are generated by using pairs of difference sets rD and nD where the multipliers r and n are {3, 5} and {−1, 1, 3, 5, 7, 11} respectively. Again, these 12 are all different in that no two of them are the same even when cyclically shifted by any shift amount. This time each of them is also of length 31 but has 15 0s, 6 −1s and 10 1s. So they have 15 zero values and 16 non-zero values. The actual codes are as follows:

```
--0-+00-++0000+-0+0+00+000+0++-
--+-0++-000+0+0-+0+0000++00+00-
00-00-+0000-0++0-0+000+-+0++++-
00-0+-00+++-+000-+0+++0-0+0000-
0000-0+0---+0++000-+-++00++0+00-
0000+0-0+++0+-000+-+++00-+0-00-
00+00++0000+0+-0+0+000-++0-+---
00+0++00++-+-000++0+--0+0-0000-
++0+-00+--0000++0-0--00+000+0++-
++0+000+00-0-0++0000--+00-+0++-
++0+000+00+0+0-+0000++-00+-0---
++++0+-+000+0-0++0-0000+-00-00-
```

In this notation, − is minus one, 0 is zero and + is plus one.

Again, all the codes have perfect periodic auto-correlation but a further useful property is that if the absolute value of the code is taken, i.e., substituting a 1 for −1, this modified code has 2 valued autocorrelation. In this case 16 and 8 are the two values. If we denote the original code OC and the modified code MC1 and make a further modification where all zeros in MC1 are replaced by −1. Denote this further modified code MC2. The periodic cross correlation of MC1 by MC2 is useful because it is zero valued at all points except for the zero shift point.

Again, this is useful because a receiver which consists of an energy detector followed by a correlator can get an estimate of the channel impulse response, but in this case there is greater noise immunity because the two values of the autocorrelation (of MC1) are further apart.

One aspect of the invention is to take a set of codes like these 12 length 31 PAC codes and generate a new set with better properties. The starting point in this example is the 12 codes, but it could be any set of codes with perfect periodic autocorrelation.

Figure 2:
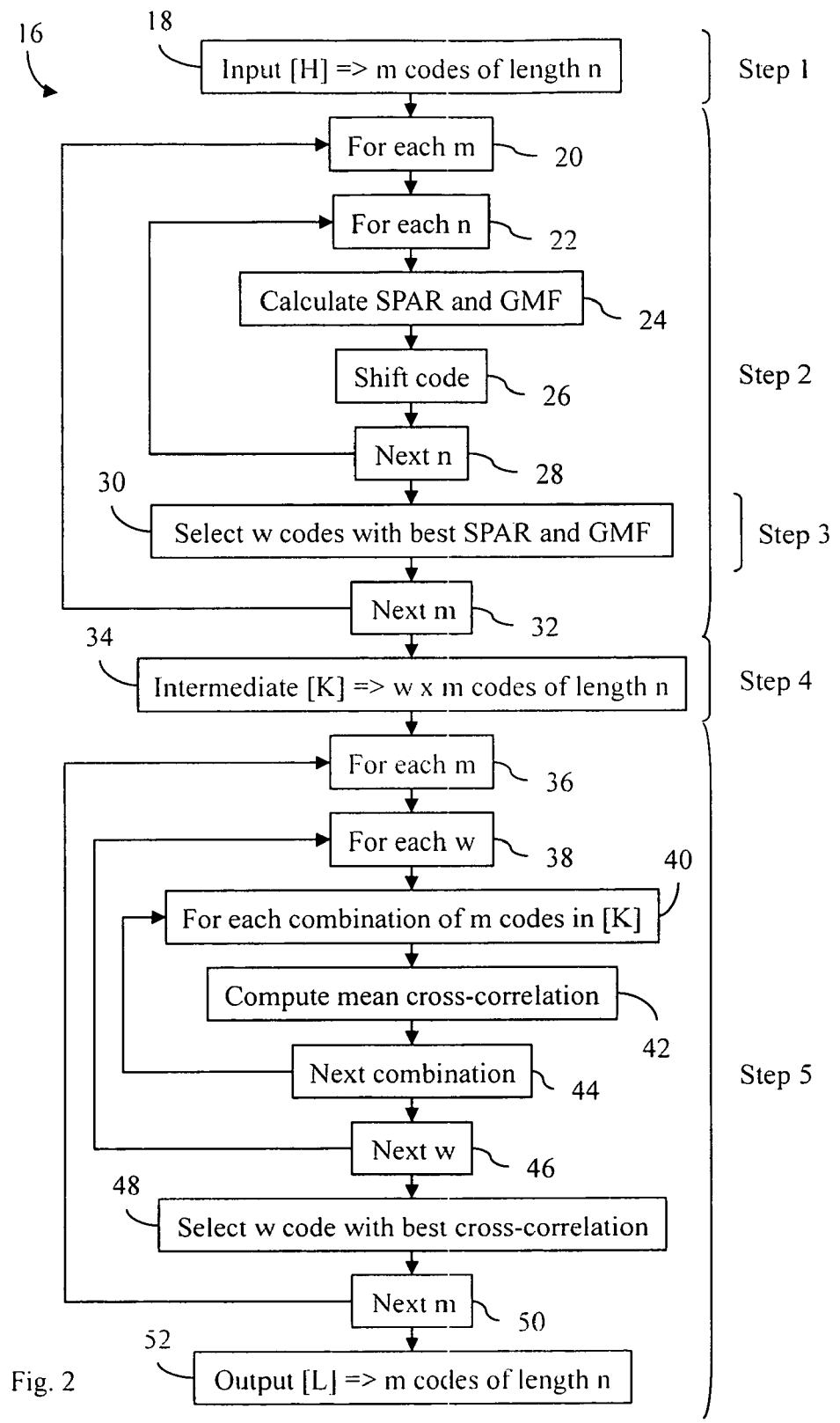
FIG. 2 is a flow diagram illustrating a method for generating codewords for use in the communications system shown in FIG. 1.

The following procedure 16 (see, FIG. 2) may be used to generate better codes:

Step 1: Take any codeset H (step 18) with m different codes of length n, this means that H is composed +1, −1 and 0. The codes should be different in that no code is the same as any other, even when cyclically shifted.

Step 2: For each code in H (steps 20 and 28), i.e. each row of H, measure the SPAR and the GMF (step 24). (The SPAR can be measured by, for example, getting the FFT of a sequence consisting of the code with n zeros appended to each side of the code and dividing the peak power of the FFT bins by the mean power of the bins.). Do this for the code and for the code cyclically shifted (step 26) by all possible shifts from 1 to n (steps 22 and 28).

Step 3: Remember a small number, say w, of the best results (step 30). The way to define which is the best can be varied but one way would be to say one shift is better than another if the SPAR divided by the GMF is lower. This is because low SPAR is good and high GMF is good.

Step 4: Form a new matrix, K, the rows of which are the w best shifted codes from Step 3 (step 34). K now has w×m rows, each with a good code in it.

Step 5: Now we want to go back to m rows. We do this by choosing (step 48) only one of the w that we selected earlier on, for each m rows (steps 36 and 50). We will decide which one to take based on how low the cross correlation of the m we select is. We only take one from the w shifts (steps 38 and 46) and because we want a matrix with low cross correlation and in general, the cross correlation between codes which are the same, but shifted, will be relatively high. To do this we measure the mean cross correlation (step 42) between all possible combinations (steps 40 and 44) where only one of the w alternative possibilities is selected. If this is a very large number, a smaller w can be chosen in an earlier step, or a limited number of possibilities can be measured. We select the combination with the minimum mean cross correlation.

We now have a new matrix L (step 52) with codes which have good SPAR, good GMF and good cross correlation. As an example this was done with the length 31 codes enumerated earlier and the following 12 codes were the result.

```
00+-0+0+00+000+0++----0-+00-++00      * **
0++00+00---+-0++-000+0+0-+0+000
-0++0-0+000+-+0++++--00-00-+0000
0++++-+000-+0+++0-0+0000-00-0+-0      *
+0---+0++000-+-++00++0+00-0000-0      * **
00-+0-00-0000+0-0+++0+-000+-+++
+0+-0+0+000-++0-+----00+00++0000      *
```

```
-0000--00+0++00++-+-000++0+--0+0
000+0++-++0+-00+--0000++0-0-00+
000+00-0-0++0000--+00-+0++-++0+          *
++-00+-0---++0+000+00+0+0-+0000
000+-00-00-++++0+-+000+0-0++0-0          * **
```

\* Combination of 6 codes with best cross correlation
\*\* Combination of 3 codes with best cross correlation The mean GMF of the new codes is 5.12 compared to 2.55 for the original set. The mean SPAR is 2.31 compared to 3.04.

Applying this technique to the length 31 codes with only six zeros gave the following results.

The original 20 codes were this:

```
--++-++++-+0+++0-0-+0--+-++00+-
-00--+-++0+-0+0+++0--+++-+++-+-
-+-+-0+00++--0-+++++-+++-0++-0-
-+-+-++---+0+---0+0+++++0-+00++-
-+++-0+00+-++0+-+-++++++---0--+0-
-+++-++00+-0+0++-+++0----+-+0+-
0---0+-++-0+-+-+++---+++00+0+++-
0-++0-+++-+++++-0--++00+0-+-+--
0+---0-+++++-+-+0++-+00+0-+++--
0++-0+-+++0-++++-++----00+0+-+-
+--++++++-0+-+-0-0-++--0+00++-
+-+0+00----++-++++-0+++-+0-++0-
+-+++-+++--0+++0+0-+0++-+--00--
+0-+++++--0-+----+0+0++00-++-+++-
+00++-+---0+-0-0+++0+-++++-++---
+0+-+----0+++-++0+0-+00++-+++--
++00+-0++++++0+0---+0+--++-+-+--
++00++0--++-0-0-+-+0-++++++--+-
+++-++-00++0+0+---+-0--+++++-0+-
+++0+00+++--+++-+-+0-++-+0---0-
```

After applying this technique to these codes the following new 20 codes were found:

```
0-+0--+-++00+---++-++++-+0+++0-
+-++0+-0+0+++0--+++-+++-+--00--
++--0-+++++-+++-0++-0--+-0+00
--0+0++++++0-+00++--+-+-++--+0+-
++++--0--+0--+++-0+00--++0+-+-+
+00+--0+0++-+++0----+-+0+--+++-+
-+++---+++00+0+++---0+-++-0++-+
0+0-+-+--0-++0-+++-+++++-0--++0
+-+-+0++-+00+0-+++--0+---0-++++
-00+0+-+-0++-0+-++0-++++-++---
++--0++00++-+--+++++++-0+-+-0-0-
---++-++++-0+++-+0-++0-+-+0+00-
--00--+-+++-+++---0++++0+0-+0++-+
-++-+++-+0-++++--0-+----+0+0++00
0-0+++0+-++++-++----+00++-+--0+-
+-+++--+0+-+----0+++-++0+0-+00+
-+0+--++-+-+--++00-0++++++0+0--++
-0-0-+-+0-++++++--+-++00++0--++
0++0+0+----+-0--++++-0+-+++-++-0
+-+0-++-+0---0-+++0+00+++--+++
```

Quite a few variations on this technique are possible to change the outcome, some of these include for example:

i) Instead of improving the GMF and SPAR, some other quality could be improved, e.g. GMF only, SPAR only.

ii) In the final step where the mean cross correlation is minimized, some other measure could be minimized or maximized e.g. the maximum cross correlation could be minimized.

In the preceding description, certain specific details of the disclosed embodiment such as architecture, example codes, interfaces and techniques, etc, are set forth for purposes of explanation rather than limitation, so as to provide a clear and thorough understanding of the present invention. However, it should be understood readily by those skilled in this art, that the present invention may be practiced in other embodiments which do not conform exactly to the details set forth herein, without departing significantly from the spirit and scope of this disclosure. Further, in this context, and for the purposes of brevity and clarity, detailed descriptions of well-known apparatus, circuits and methodology have been omitted so as to avoid unnecessary detail and possible confusion.

What is claimed is:

1. A method for generating codewords for use in a communication system, said codewords having perfect periodic auto-correlation (PAC), improved Golay merit factor (GMF), and improved spectral peak to average ratio (SPAR), comprising the steps of:
   (1) selecting a codeword set, H, comprising a number, m, of different codewords, each of length, n, such that each of said codewords has perfect periodic autocorrelation and no codeword in said codeword set is the same as any other, even when cyclically shifted;
   (2) measuring the SPAR and GMF for each codeword m in H and for said codeword m cyclically shifted by all possible shifts from 1 to n;
   (3) remembering, for each codeword m in H, a small number, w, of said m cyclically shifted codewords having a best measured SPAR and GMF in step 2;
   (4) forming a new matrix, K, the rows of which are the w×m best shifted codewords from step 3; and
   (5) choosing from K, for each of the m codewords in H, only one of the w codewords selected in step 3, based on a cross correlation of all m chosen codewords.

2. The method of claim 1 further comprising the steps of:
   selecting one of said m chosen codewords; and
   transmitting a signal comprising said selected codeword.

3. The method of claim 2 further comprising the steps of:
   receiving said transmitted signal; and
   detecting said selected codeword.

4. The method of claim 1 further comprising the steps of:
   selecting one of said m chosen codewords;
   receiving a transmitted signal comprising said selected codeword; and
   detecting said selected codeword.

5. A method for generating codewords for use in a communication system, comprising the steps of:
   (1) selecting a codeword set, H, comprising an integer number, m, of different codewords, each of integer length, n, such that each of said codewords has perfect periodic autocorrelation and no codeword in said codeword set is the same as any other, even when cyclically shifted;
   (2) measuring a quality for each codeword m in H and for said codeword m cyclically shifted by all possible shifts from 1 to n;
   (3) remembering, for each codeword m in H, a small number, w, of said m cyclically shifted codewords having a best measured quality in step 2;
   (4) forming a new matrix, K, the rows of which are the w×m best shifted codewords from step 3; and
   (5) choosing from K, for each of the m codewords in H, only one of the w codewords, based on a cross correlation of all m chosen codewords.

6. The method of claim 5 wherein the quality measured in step 2 is a Golay merit factor.

7. The method of claim 5 wherein the quality measured in step 2 is a spectral peak to average ratio.

8. The method of claim 5 wherein the quality measured in step 2 is both a Golay merit factor and a spectral peak to average ratio.

9. The method of claim 5 further comprising the steps of:
selecting one of said m chosen codewords; and
transmitting a signal comprising said selected codeword.

10. The method of claim 9 further comprising the steps of:
receiving said transmitted signal; and
detecting said selected codeword.

11. The method of claim 5 further comprising the steps of:
selecting one of said m chosen codewords;
receiving a transmitted signal comprising said selected codeword; and
detecting said selected codeword.

12. A method for generating, from a codeword set, H, comprising an integer number, m, of different codewords, each of integer length, n, such that each of said codewords has perfect periodic autocorrelation and no codeword in said codeword set is the same as any other, even when cyclically shifted, codewords for use in a communication system, said codewords having perfect periodic auto-correlation (PAC), improved Golay merit factor (GMF), and improved spectral peak to average ratio (SPAR), comprising the steps of:
(1) measuring the SPAR and GMF for each codeword m in H and for said codeword m cyclically shifted by all possible shifts from 1 to n;
(2) remembering, for each codeword m in H, a small number, w, of said m cyclically shifted codewords having a best measured SPAR and GMF; and
(3) choosing, for each of the m codewords in H, only one of the w codewords remembered in step 2, based on a cross correlation of all m chosen codewords.

13. The method of claim 12 further comprising the steps of:
selecting one of said m chosen codewords; and
transmitting a signal comprising said selected codeword.

14. The method of claim 13 further comprising the steps of:
receiving said transmitted signal; and
detecting said selected codeword.

15. The method of claim 12 further comprising the steps of:
selecting one of said m chosen codewords;
receiving a transmitted signal comprising said selected codeword; and
detecting said selected codeword.

16. A method for generating, from a codeword set, H, comprising a number, m, of different codewords, each of length, n, such that each of said codewords has perfect periodic autocorrelation and no codeword in said codeword set is the same as any other, even when cyclically shifted, codewords for use in a communication system, comprising the steps of:
(1) measuring a quality of each codeword m in H and for said codeword m cyclically shifted by all possible shifts from 1 to n;
(2) remembering, for each codeword m in H, a small number, w, of said m cyclically shifted codewords having a best measured quality in step 1; and
(3) choosing, for each of the m codewords in H, only one of the w codewords remembered in step 2, based on a cross correlation of all m chosen codewords.

17. The method of claim 16 wherein the quality measured in step 1 is a Golay merit factor.

18. The method of claim 16 wherein the quality measured in step 1 is a spectral peak to average ratio.

19. The method of claim 16 wherein the quality measured in step 1 is both a Golay merit factor and a spectral peak to average ratio.

20. The method of claim 16 further comprising the steps of:
selecting one of said m chosen codewords; and
transmitting a signal comprising said selected codeword.

21. The method of claim 20 further comprising the steps of:
receiving said transmitted signal; and
detecting said selected codeword.

22. The method of claim 16 further comprising the steps of:
selecting one of said m chosen codewords;
receiving a transmitted signal comprising said selected codeword; and
detecting said selected codeword.

* * * * *